United States Patent
Ha

(10) Patent No.: US 7,710,162 B2
(45) Date of Patent: May 4, 2010

(54) DIFFERENTIAL AMPLIFIER

(75) Inventor: Sung-Joo Ha, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 153 days.

(21) Appl. No.: 11/478,091

(22) Filed: Jun. 30, 2006

(65) Prior Publication Data

US 2007/0069767 A1    Mar. 29, 2007

(30) Foreign Application Priority Data

Sep. 29, 2005   (KR) .................. 10-2005-0091546
Dec. 15, 2005   (KR) .................. 10-2005-0123979

(51) Int. Cl.
*H03F 3/45* (2006.01)

(52) U.S. Cl. ................. 327/52; 327/53; 327/307; 327/65; 327/67; 330/259; 330/260

(58) Field of Classification Search .............. None
See application file for complete search history.

(56) References Cited

U.S. PATENT DOCUMENTS

| | | | | |
|---|---|---|---|---|
| 5,192,878 A * | 3/1993 | Miyamoto et al. | ............ | 327/77 |
| 5,347,183 A | 9/1994 | Phelan | ................. | 327/52 |
| 5,550,491 A * | 8/1996 | Furuta | ................. | 326/115 |
| 5,568,092 A | 10/1996 | Shimizu et al. | ........... | 330/260 |
| 5,600,269 A * | 2/1997 | Song et al. | ................. | 327/52 |
| 5,721,513 A | 2/1998 | Yuasa | ................. | 330/282 |
| 5,796,273 A * | 8/1998 | Jung et al. | ................. | 327/55 |
| 5,838,200 A | 11/1998 | Opris | ................. | 330/258 |
| 5,990,737 A * | 11/1999 | Czarnul et al. | ............ | 330/69 |
| 6,008,696 A | 12/1999 | Smith | ................. | 330/260 |
| 6,054,879 A | 4/2000 | Meng | ................. | 327/54 |
| 6,128,236 A | 10/2000 | Faue et al. | ............... | 365/207 |
| 6,300,833 B1 | 10/2001 | Vyne et al. | ............... | 330/257 |
| 6,304,144 B1 | 10/2001 | Yamazaki et al. | ........ | 330/259 |
| 6,535,534 B1 * | 3/2003 | Fischer | .............. | 372/38.07 |
| 6,856,197 B1 | 2/2005 | Humphrey | ............ | 330/252 |
| 6,963,237 B2 * | 11/2005 | Tamura et al. | ............ | 327/292 |
| 7,233,172 B2 * | 6/2007 | Kanamori et al. | ......... | 327/55 |

(Continued)

FOREIGN PATENT DOCUMENTS

JP    5-275942    10/1993

(Continued)

OTHER PUBLICATIONS

Korean Office Action issued in Korean Patent Application No. KR 10-2005-0123979, mailed Jul. 5, 2007.

(Continued)

*Primary Examiner*—Tuan Lam
*Assistant Examiner*—Hiep Nguyen
(74) *Attorney, Agent, or Firm*—IP & T Law Firm PLC

(57) ABSTRACT

A differential amplifier includes an amplification unit and a feedback unit. The amplification unit amplifies a voltage difference between a first input signal and a second input signal and outputs a first output signal and a second output signal. The feedback unit amplifies a voltage difference between a first feedback signal based on the first output signal and a second feedback signal based on the second output signal.

23 Claims, 4 Drawing Sheets

U.S. PATENT DOCUMENTS

| | | | |
|---|---|---|---|
| 2005/0156665 A1* | 7/2005 | Maejima | 330/251 |
| 2006/0125533 A1* | 6/2006 | Kim et al. | 327/112 |
| 2006/0279293 A1* | 12/2006 | Atris et al. | 324/658 |
| 2008/0056037 A1* | 3/2008 | Chang | 365/203 |
| 2008/0100347 A1* | 5/2008 | Uchiki | 327/52 |

FOREIGN PATENT DOCUMENTS

| | | |
|---|---|---|
| JP | 8-97704 | 4/1996 |
| JP | 2002-15577 A | 1/2002 |
| KR | 93-12302 | 6/1993 |
| KR | 10-2005-0073755 | 7/2005 |
| TW | 423218 | 2/2001 |
| TW | 535162 | 6/2003 |
| TW | 200303651 | 9/2003 |

OTHER PUBLICATIONS

Search Report issued by the Taiwanese Intellectual Property Office together with an Office Action on Mar. 23, 2009.

* cited by examiner

DIFFERENTIAL AMPLIFIER

FIELD OF THE INVENTION

The present invention relates to a differential amplifier; and, more particularly, to a differential amplifier for reliably performing an amplifying operation.

DESCRIPTION OF RELATED ARTS

A differential amplifier multiplies a voltage difference between two inputs by a constant factor to obtain a differential gain. Many integrated circuits including dynamic random access memory (DRAM) use the differential amplifier for signal amplification.

FIG. 1 is a typical block diagram of a differential amplifier.

As shown in FIG. 1, the differential amplifier 1 amplifies the voltage difference between a first input IN and the second input INB and outputs a first output OUT and a second output OUTB.

FIG. 2 is a schematic circuit diagram of the differential amplifier shown in FIG. 1.

As shown in FIG. 2, the differential amplifier 1 includes a first amplification unit 10, a second amplification unit 20, and an initialization unit 30. The first amplification unit 10 outputs the second output OUTB by amplifying the voltage difference between the first input IN and the second input INB in response to an enable signal EN. The second amplification unit 20 outputs the first output OUT by amplifying the voltage difference between the first input IN and the second input INB in response to the enable signal EN. The initialization unit 30 stabilizes the level of the first and the second outputs OUT and OUTB and outputs the first and the second outputs OUT and OUTB in response to an inactivation of the enable signal EN.

The first amplification unit 10 includes four NMOS transistors NM1 to NM4 and two PMOS transistors PM1 and PM2. The first and the second NMOS transistors NM1 and NM2 connected each other in parallel receives the enable signal EN through their gates and are connected to a ground voltage VSS terminal. The third and the fourth NMOS transistors NM3 and NM4 are connected with each other in parallel and respectively receive the first input IN and the second input INB through their gates. A common node of the third and the fourth NMOS transistors NM3 and NM4 is coupled to a common node of the first and the second NMOS transistors NM1 and NM2. The first PMOS transistor PM1 is connected between the third NMOS transistor NM3 and a power supply voltage VDD terminal and the fourth PMOS transistor PM2 is connected between the fourth NMOS transistor NM4 and the power supply voltage VDD terminal. A voltage at a node A connected to a first terminal of the fourth NMOS transistor NM4 is received at the gates of transistors PM1 and PM2. The first amplification unit 10 outputs a voltage at a common node of the first PMOS transistor PM1 and the third NMOS transistor NM3 as the second output OUTB.

The second amplification unit 20 has similar circuitry to the circuitry of the first amplification unit 10. However, the second amplification unit 20 outputs a voltage at a common node of a PMOS transistor and a NMOS transistor, the latter receiving the second input INB through its gate, as the first output OUT.

As above described, the differential amplifier includes the first and the second amplification unit 10 and 20 implemented with a current mirror in order to amplify the voltage difference between the first and the second inputs IN and INB. If the voltage difference between the first and the second input signals IN and INB are too small, it is possible that the differential amplifier cannot fully amplify the difference between the first and the second input signals IN and INB and, therefore, the first and the second output signals OUT and OUTB cannot be correctly recognized.

FIG. 3 is a waveform demonstrating operation of the differential amplifier shown in FIG. 1.

As shown in FIG. 3, the differential amplifier amplifies the voltage difference between the first and the second input signals IN and INB of about 10 mV and outputs the first and the second output signals OUT and OUTB whose voltage difference is about 330 mV. In this case, logic levels of the first and the second output signals OUT and OUTB cannot be properly recognized.

SUMMARY OF THE INVENTION

It is, therefore, an object of the present invention to provide a differential amplifier for reliably performing an amplifying operation.

In accordance with an aspect of the present invention, there is provided a differential amplifier including an amplification unit and a feedback unit. The amplification unit amplifies a voltage difference between a first input signal and a second input signal and outputs a first output signal and a second output signal. The feedback unit amplifies a voltage difference between a first feedback signal based on the first output signal and a second feedback signal based on the second output signal.

In accordance with another aspect of the present invention, there is provided a differential amplifier including a first and a second feedback amplification units and an initialization unit. The first feedback amplification unit receives first and second input signals and first and second feedback signals in response to an enable signal and outputs a second output signal. The second feedback amplification unit receives the first and the second input signals and the first and the second feedback signals in response to the enable signal and outputs a first output signal. The initialization unit initializes a first and a second output node in response to the enable signal. The first feedback signal based on the first output signal is loaded at the second output node and the second feedback signal based on the second output signal is loaded at the first output node.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a differential amplifier in accordance with the present invention will be described in detail referring to the accompanying drawings.

Figure 1:
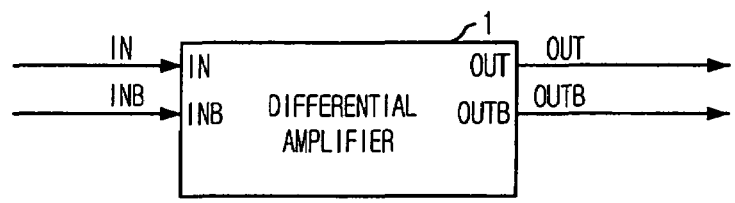
FIG. 1 is a block diagram of a conventional differential amplifier.
Figure 2:
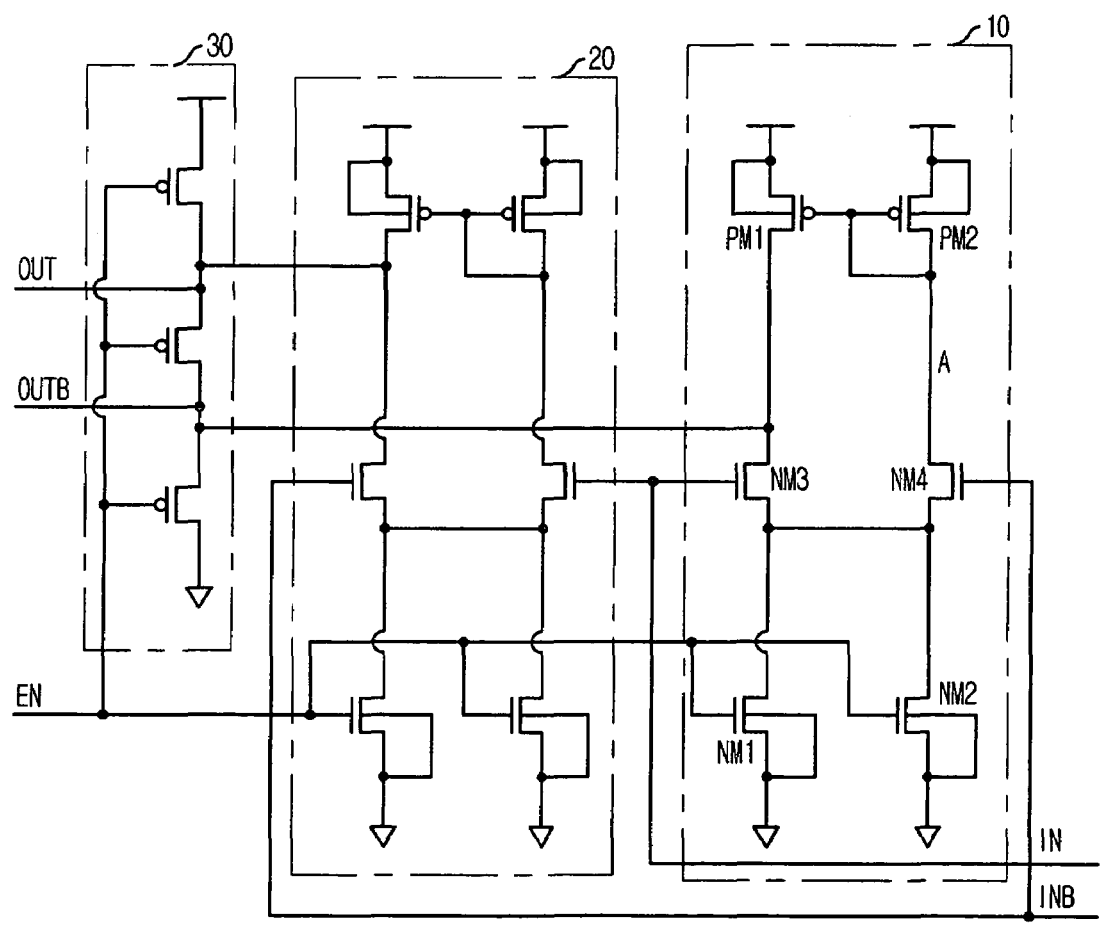
FIG. 2 is a schematic circuit diagram of the differential amplifier shown in FIG. 1.
Figure 3:
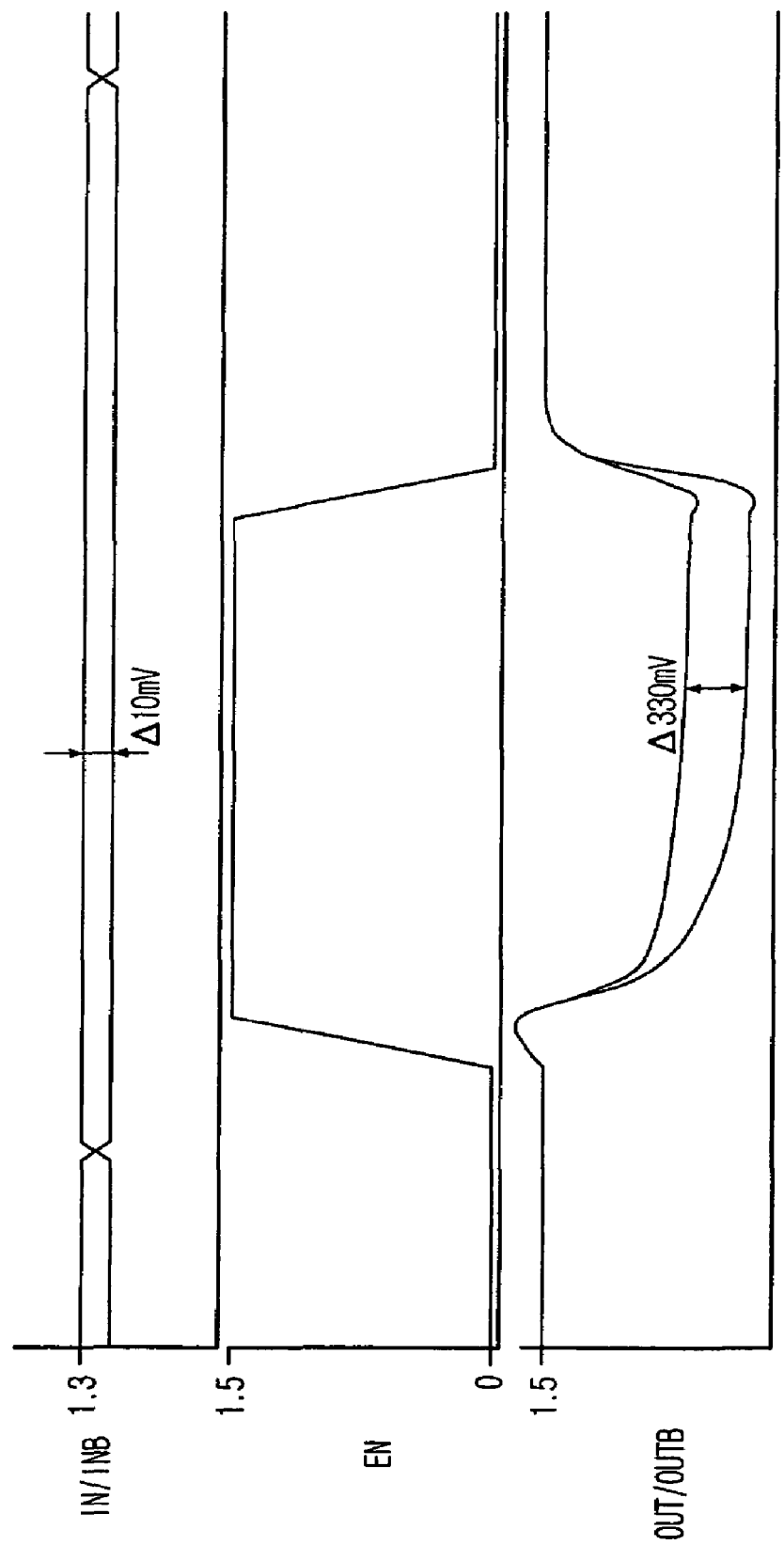
FIG. 3 is a waveform demonstrating operation of the differential amplifier shown in FIG. 1.
Figure 4:
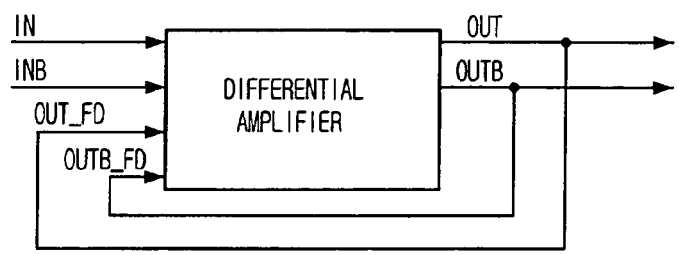
FIG. 4 is block diagram of a differential amplifier in accordance with an embodiment of the present invention.

FIG. 4 is block diagram showing a differential amplifier in accordance with an embodiment of the present invention.

As shown in FIG. 4, the differential amplifier amplifies the voltage difference between a first input IN and the second input INB and outputs a first output OUT and a second output OUTB. Further, the differential amplifier receives the first and the second outputs OUT and OUTB as first and second feed-back signals OUT_FD and OUTB_FD in order to re-amplify the voltage difference between the first and the second outputs OUT and OUTB.

Figure 5:
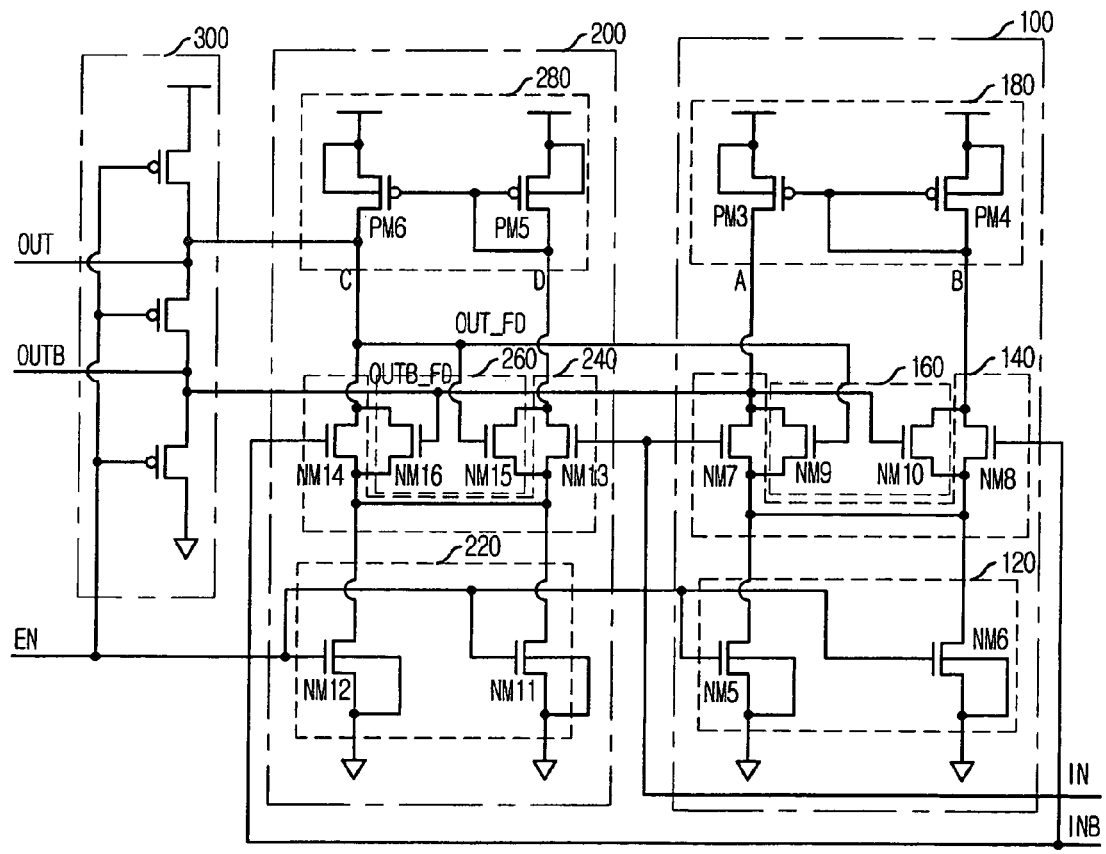
FIG. 5 is a schematic diagram of the differential amplifier shown in FIG. 3.

FIG. 5 is a schematic diagram depicting the differential amplifier shown in FIG. 4.

As shown in FIG. 5, the differential amplifier includes a first amplification unit 100, a second amplification unit 200, and an initialization unit 300. The first amplification unit 100 outputs the second output OUTB by amplifying the voltage difference between the first input IN and the second input INB in response to an enable signal EN. The first amplification unit 100 further receives the first and the second feed-back signals OUT_FD and OUTB_FD and modulates the level of the second output OUTB. The second amplification unit 200 outputs the first output OUT by amplifying the voltage difference between the first input IN and the second input INB in response to an enable signal EN. The second amplification unit 200 receives the first and the second feed-back signals OUT_FD and OUTB_FD and modulates the level of the first output OUT. The initialization unit 300 stabilizes the level of the first and the second outputs OUT and OUTB and outputs the first and the second outputs OUT and OUTB in response to an inactivation of the enable signal EN.

The first amplification unit 100 includes an input unit 140, a feedback unit 160, a load unit 180, and a bias supply unit 120. The bias supply unit 120 provides the input unit 140, the load unit 180, and the feedback unit 160 with a bias current in response to the enable signal EN. The input unit 140 controls a voltage level of a first output node A according to the voltage difference between the first input signal IN and the second input signal INB. The voltage loaded at first output node A is output as the second output signal OUTB. The load unit 180 provides the input unit 140 and the feedback unit 160 with current determined by the input unit 140 and the feedback unit 160. The feedback unit 160 controls the voltage level of the first output node A according to the voltage difference between the first and the second feedback signals OUT_FD and OUTB_FD.

In detail, the bias supply unit 120 includes two NMOS transistors NM5 and NM6 are connected between the input unit 140 and a ground voltage VSS terminal and receive the enable signal EN through their gates. The input unit 140 includes two NMOS transistors NM7 and NM8 connected each other in parallel. The seventh NMOS transistor NM7 is connected between the first output node A and the bias provider 120 and receives the first input signal IN through its gate. The eighth NMOS transistor NM8 is connected between the load unit 180 and the bias provider 120 and receives the second input signal INB through its gate. The feedback unit 160 includes two NMOS transistors NM9 and NM10. The ninth NMOS transistor NM9 receives the first feedback signal OUT_FD through its gate. The first and second terminals of transistor NM9 are connected to those of the seventh NMOS transistor NM7. The tenth NMOS transistor NM10 receives the second feedback signal OUTB_FD through its gate. The first and second terminals of transistor NM10 are connected to those of the eighth NMOS transistor NM8. The load unit 180 includes two PMOS transistors PM3 and PM4. The fourth PMOS transistor PM4 connected to the eighth NMOS transistor NM8 receives a voltage at a common node B of the fourth PMOS transistor PM4 and the eighth NMOS transistor NM8 through its gate. The third PMOS transistor PM3 is connected to the seventh NMOS transistor NM7 at the first output node A and receives the voltage at the common node B at its gate.

The second amplification unit 200 includes an input unit 240, a feedback unit 260, a load unit 280, and a bias supply unit 220. The bias supply unit 220 provides the input unit 240, the load unit 280, and the feedback unit 260 with a bias current in response to the enable signal EN. The input unit 240 controls a voltage level of a second output node C according to the voltage difference between the first input signal IN and the second input signal INB. The voltage loaded at first output node C is output as the first output signal OUT. The load unit 280 provides the input unit 240 and the feedback unit 260 with current determined by the input unit 240 and the feedback unit 260. The feedback unit 260 controls the voltage level of the second output node C according to the voltage difference between the first and the second feedback signals OUT_FD and OUTB_FD.

In detail, the bias supply unit 120 includes two NMOS transistors NM11 and NM12, connected between the input unit 240 and the ground voltage VSS terminal, receive the enable signal EN through their gates. The input unit 240 includes two NMOS transistors NM13 and NM14. The thirteenth NMOS transistor NM13, connected between the load unit 280 and the bias provider 220, receives the first input signal IN through its gate. The fourteenth NMOS transistor NM14, connected between the second output node C and the bias provider 220, receives the second input signal INB through its gate. The feedback unit 260 includes two NMOS transistors MN15 and MN16. The fifteenth NMOS transistor MN15 receives the first feedback signal OUT_FD through its gate. First and second terminals of transistor MN15 are connected to those of the thirteenth NMOS transistor N13. The sixteenth NMOS transistor NM16 receives the second feedback signal OUTB_FD through its gate. First and second terminals of transistor MN16 are connected to those of the fourteenth NMOS transistor NM14. The load unit 280 includes two PMOS transistors PM5 and PM6. The fifth PMOS transistor PM5, connected to the thirteenth NMOS transistor NM13, receives at its gate a voltage at a common node D of the fifth PMOS transistor PM5 and the thirteenth NMOS transistor NM13. The sixth PMOS transistor PM6, connected to the fourteenth NMOS transistor NM14 through the second output node C, receives the voltage at the common node D at its gate.

As above described, the differential amplifier further includes the feedback units 160 and 260 receiving the first and the second feedback signals OUT_FD and OUTB_FD in order to re-amplify the voltage difference between the first and the second outputs OUT and OUTB.

Figure 6:
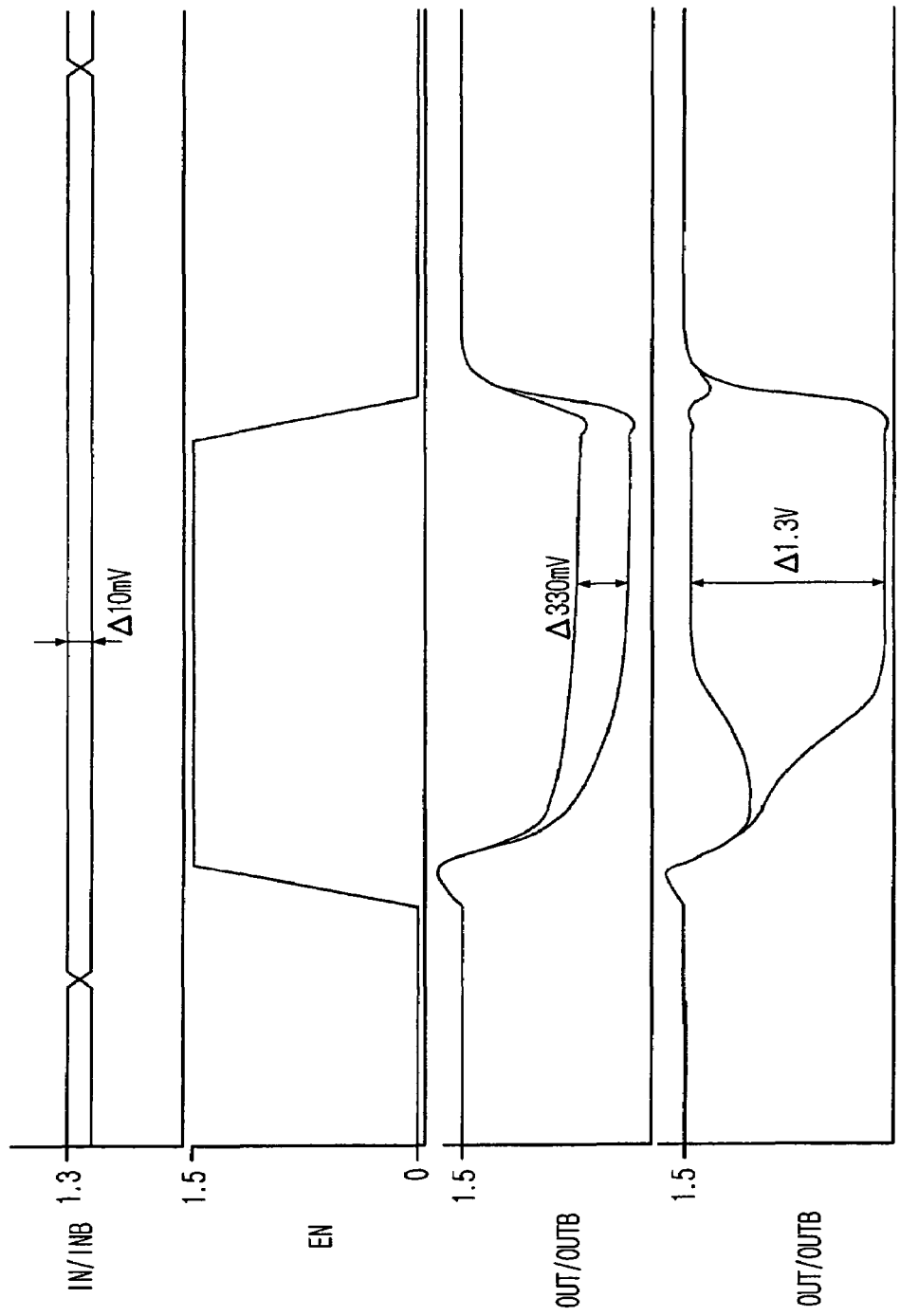
FIG. 6 is waveform demonstrating operation of the differential amplifier shown in FIG. 4.

FIG. 6 is waveform demonstrating an operation of the differential amplifier shown in FIG. 4.

As shown, the difference of the input signals IN and INB is about 10 mV. When the enable signal EN is activated as a logic high level, the differential amplifier amplifies the voltage difference of the input signal and outputs the first and the second output signals OUT and OUTB whose voltage difference is about 1.3V.

The differential amplifier is fed back the output signals OUT and OUTB and re-amplifies the voltage difference of the output signals OUT and OUTB. Therefore, the voltage difference of output signals of differential amplifier is increased. That is, the differential amplifier reliably performs an amplifying operation.

The present application contains subject matter related to Korean patent application No. 2005-91546 and No. 2005-123979, filed in the Korean Patent Office on Sep. 29, 2005, and on Dec. 15, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A differential amplifier, comprising:
   an input unit configured to control voltage levels of a first output node and a second output node according to a voltage difference between a first input signal and a second input signal;
   a feedback input unit configured to control the voltage levels of the first output node and the second output node according to a voltage difference between first and second feedback signals respectively fed back from the first output node and the second output node;
   a load unit having at least two transistors coupled with each other at their gates to provide the input unit and the feedback unit with current determined by the input unit and the feedback unit, wherein one of the two transistors is diode-connected, the other transistor is coupled to a corresponding one of the first and second output nodes, and voltages loaded at the first and the second output nodes are respectively output as a first output signal and a second output signal;
   an initialization unit configured to initialize the first and the second output nodes in response to an enable signal; and
   a bias provider configured to control the activation of the differential amplifier by providing the input unit, the load unit, and the feedback unit with a bias current in response to the enable signal,
   wherein the input unit includes:
      a first input unit provided with first and second NMOS transistors, connected between the load unit and the bias provider, for respectively receiving the first input signal and the second input signal through their gates; and
      a second input unit provided with third and fourth NMOS transistors, connected between a load unit and the bias provider, for respectively receiving the first input signal and the second input signal through their gates, wherein a first terminal of the first NMOS transistor is connected to the second output node and a first terminal of the fourth NMOS transistor is connected to the first output node, wherein the feedback unit includes:
         a fifth NMOS transistor receiving the first feedback signal from the first output node at its gate, wherein the gate of the fifth NMOS transistor is not connected to a source of a sixth NMOS transistor;
         the sixth NMOS transistor receiving the second feedback signal from the second output node at its gate, wherein the gate of the sixth NMOS transistor is connected to a source of the fifth NMOS transistor;
         a seventh NMOS transistor receiving the first feedback signal from the first output node at its gate, wherein the gate of the seventh NMOS transistor is not connected to a source of an eighth NMOS transistor; and
         the eighth NMOS transistor receiving the second feedback signal from the second output node at its gate, wherein the gate of the eighth NMOS transistor is connected to a source of the seventh NMOS transistor.

2. The differential amplifier as recited in claim 1, wherein the load unit includes:
   a first load unit provided with first and second PMOS transistors connected between the first input unit and a power supply voltage terminal; and
   a second load unit provided with third and fourth PMOS transistors connected between the second input unit and the power supply voltage terminal.

3. The differential amplifier as recited in claim 2, wherein the first PMOS transistor is connected to the first NMOS transistor through the second output node and receives at its gate a voltage at a first common node of the second PMOS transistor and the second NMOS transistor.

4. The differential amplifier as recited in claim 3, wherein the second PMOS transistor is connected to the second NMOS transistor and receives at its gate the voltage at the first common node.

5. The differential amplifier as recited in claim 4, wherein the third PMOS transistor is connected to the third INMOS transistor and receives at its gate a voltage at a second common node of the third PMOS transistor and the third NMOS transistor.

6. The differential amplifier as recited in claim 5, wherein the fourth PMOS transistor is connected to the fourth NMOS transistor through the first output node and receives at its gate the voltage at the second common node.

7. The differential amplifier as recited in claim 6, wherein the bias provider includes a plurality of NMOS transistors connected between the input unit and a ground voltage terminal, each of which receives the enable signal at its gate.

8. The differential amplifier as recited in claim 7, wherein the feedback unit includes:
   the fifth NMOS transistor having first and second terminals that are connected to first and second terminals of the first NMOS transistor;
   the sixth NMOS transistor having first and second terminals that are connected to first and second terminals of the second NMOS transistor;
   the seventh NMOS transistor having first and second terminals that are connected to first and second terminals of the third NMOS transistor; and
   the eighth NMOS transistor having first and second terminals that are connected to first and second terminals of the fourth NMOS transistor.

9. A differential amplifier, comprising:
   a first feedback amplification unit configured to receive a first input signal and a second input signal, a first feedback signal and a second feedback signal in response to an enable signal and output a second output signal, wherein the first feedback amplification unit includes a first feedback unit configured to amplify a voltage difference between the first and the second feedback signals;
   a second feedback amplification unit configured to receive the first and second input signals and the first and second feedback signals in response to the enable signal and output a first output signal, wherein the first feedback amplification unit includes a second feedback unit configured to amplify a voltage difference between the first and the second feedback signals; and
   an initialization unit configured to initialize first and second output nodes in response to the enable signal,
   wherein each of the first and second feedback amplification units includes a load unit having at least two transistors coupled with each other at their gates, one of the two transistors being diode-connected and the other transistor being coupled to a corresponding one of the first and second output nodes, and the first feedback signal based on the first output signal is loaded at the first output node and the second feedback signal based on the second output signal is loaded at the second output node, wherein the first feedback unit includes:

a fifth NMOS transistor receiving the first feedback signal from the first output node at its gate, wherein the gate of the fifth NMOS transistor is not connected to a drain of a sixth NMOS transistor; and the sixth NMOS transistor receiving the second feedback signal from the second output node at its gate, wherein the gate of the sixth NMOS transistor is connected to a source of the fifth NMOS transistor, and wherein the second feedback unit includes:

a seventh NMOS transistor receiving the first feedback signal from the first output node at its gate, wherein the gate of the seventh NMOS transistor is not connected to a drain of an eighth NMOS transistor; and the eighth NMOS transistor receiving the second feedback signal from the second output node at its gate, wherein the gate of the eighth NMOS transistor is connected to a source of the seventh NMOS transistor.

10. The differential amplifier as recited in claim 9, wherein the first feedback amplification unit includes:

an input unit configured to control a voltage level of the second output node according to the voltage difference between the first input signal and the second input signal; and the load unit configured to provide the input unit and the first feedback unit with current determined by the input unit and the first feedback unit.

11. The differential amplifier as recited in claim 10, wherein the first feedback amplification unit further includes:

a bias provider configured to provide the input unit, the load unit, and the first feedback unit with a bias current in response to the enable signal.

12. The differential amplifier as recited in claim 11, wherein the first feedback unit controls the voltage level of the first output node according to the voltage difference between the first and the second feedback signals.

13. The differential amplifier as recited in claim 12, wherein the input unit includes:

a first NMOS transistor, connected between the second output node and the bias provider, for receiving the first input signal at its gate; and a second NMOS transistor, connected between the load unit and the bias provider, for receiving the second input signal at its gate.

14. The differential amplifier as recited in claim 13, wherein the load unit includes:

a first PMOS transistor, connected to the second NMOS transistor, for receiving a voltage loaded at a common node of the first PMOS transistor and the second NMOS transistor at its gate; and a second PMOS transistor, connected to the first NMOS transistor through the second output node, for receiving the voltage loaded at the common node at its gate.

15. The differential amplifier as recited in claim 14, wherein the bias provider includes:

a third NMOS transistor, connected between the first NMOS transistor and a ground voltage terminal, for receiving the enable signal at its gate; and a fourth NMOS transistor, connected between the second NMOS transistor and the ground voltage terminal, for receiving the enable signal at its gate.

16. The differential amplifier as recited in claim 15, wherein the first feedback unit includes:

the fifth NMOS transistor having first and second terminals that are connected to first and second terminals of the first NMOS transistor; and the sixth NMOS transistor having first and second terminals that are connected to first and second terminals of the second NMOS transistor.

17. The differential amplifier as recited in claim 10, wherein the second feedback amplification unit includes:

an input unit configured to control a voltage level of the first output node according to the voltage difference between the first input signal and the second input signal; and the load unit configured to provide the input unit of the second feedback amplification unit and the second feedback unit with current determined by the input unit of the second feedback amplification unit and the second feedback unit.

18. The differential amplifier as recited in claim 17, wherein the second feedback amplification unit further includes:

a bias provider configured to provide the input unit of the second feedback amplification unit, the load unit of the second feedback amplification unit, and the second feedback unit with a bias current in response to the enable signal.

19. The differential amplifier as recited in claim 18, wherein the second feedback unit controls the voltage level of the first output node according to the voltage difference between the first and the second feedback signals.

20. The differential amplifier as recited in claim 19, wherein the input unit of the second feedback amplification unit includes:

a first NMOS transistor, connected between the load unit of the second feedback amplification unit and the bias provider, for receiving the first input signal at its gate; and a second NMOS transistor, connected between the first output node and the bias provider, for receiving the second input signal at its gate.

21. The differential amplifier as recited in claim 20, wherein the load unit of the second feedback amplification unit includes:

a first PMOS transistor, connected to the first NMOS transistor, for receiving at its gate a voltage at a common node of the first PMOS transistor and the first NMOS transistor; and a second PMOS transistor, connected to the second NMOS transistor through the first output node, for receiving at its gate the voltage at the common node.

22. The differential amplifier as recited in claim 21, wherein the bias provider includes:

a third NMOS transistor, connected between the first NMOS transistor and a ground voltage terminal, for receiving the enable signal at its gate; and a fourth NMOS transistor, connected between the second NMOS transistor and the ground voltage terminal, for receiving the enable signal at its gate.

23. The differential amplifier as recited in claim 22, wherein the second feedback unit includes:

the seventh NMOS transistor having first and second terminals that are connected to first and second terminals of the first NMOS transistor; and the eighth NMOS transistor having first and second terminals that are connected to first and second terminals of the second NMOS transistor.

* * * * *